(12) United States Patent
Carmon et al.

(10) Patent No.: US 7,676,200 B2
(45) Date of Patent: Mar. 9, 2010

(54) CIRCUITS AND METHODS FOR HIGH-EFFICIENCY ON-CHIP POWER DETECTION

(75) Inventors: Roi Carmon, Nesher (IL); David Goren, Nesher (IL); Ullrich R. Pfeiffer, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 688 days.

(21) Appl. No.: 11/522,873

(22) Filed: Sep. 18, 2006

(65) Prior Publication Data
US 2010/0013459 A1    Jan. 21, 2010

(51) Int. Cl.
*H01Q 11/12* (2006.01)
*H04B 1/04* (2006.01)
(52) U.S. Cl. ............... 455/91; 455/115.1; 455/127.1
(58) Field of Classification Search .................. 455/91, 455/106, 114.2–115.1, 126, 127.1, 282, 333; 333/109–116
See application file for complete search history.

(56) References Cited

U.S. PATENT DOCUMENTS

| 5,832,373 | A | * | 11/1998 | Nakanishi et al. ........... 455/126 |
| 6,781,476 | B2 | * | 8/2004 | Tsunoda et al. ............. 333/110 |
| 2003/0027539 | A1 | * | 2/2003 | Nagamori et al. ........ 455/234.1 |
| 2006/0121874 | A1 | * | 6/2006 | Block et al. ................. 455/333 |
| 2006/0145310 | A1 | * | 7/2006 | Park et al. ................... 257/664 |

* cited by examiner

*Primary Examiner*—Simon D Nguyen
(74) *Attorney, Agent, or Firm*—F. Chau & Associates, LLC

(57) ABSTRACT

Power detector integrally formed within a printed transmission line to capacitively couple a portion of signal power propagating on the printed transmission line and a power detector circuit that receives coupled power output from the power detector to detect a power level of the signal power. The power detector is designed such that capacitance of the coupling capacitor is absorbed into a distributed capacitance of the transmission line to maintain continuity of a characteristic impedance of the transmission line.

18 Claims, 4 Drawing Sheets

CIRCUITS AND METHODS FOR HIGH-EFFICIENCY ON-CHIP POWER DETECTION

GOVERNMENT LICENSE RIGHTS

This invention was made with Government support under Contract No. N6601-05-C-8013 awarded by the Defense Advanced Research Projects Agency (DARPA) The Government has certain rights in this invention.

TECHNICAL FIELD

The present invention relates generally to circuits and methods for providing high efficiency on-chip power detection for microwave and millimeter wave applications and, in particular, circuits and methods for integrating power detector capacitors within printed transmission lines to achieve high-efficiency coupling and detection of high-frequency power while maintaining impedance continuity of the printed transmission line.

BACKGROUND

The continuing development and widespread implementation of wireless/radio communication systems, such as wireless PAN (personal area network), wireless LAN (local area network), wireless WAN (wide area network), cellular networks, etc., is driving the market demand for high-performance, highly-integrated and low-power, low cost solutions for on-chip radio communication systems that operate at millimeter-wave frequencies. For millimeter wave applications, integrated devices (e.g., integrated transmitter, receiver, transceiver systems) can be fabricated using GaAs or InP semiconductor technologies, as such technologies can provide the speed and power that is needed for such applications.

Wireless communication systems include transmitter circuits that typically employ a power amplifier circuit to output transmission signals at a required transmission power level to an antenna load. Moreover, automated level control (ALC) circuits are commonly employed in wireless communication systems to provide closed loop control of transmission power level for various purposes such as regulating transmission power to ensure compliance with regulations imposed on RF emissions, maintain constant transmitter output power over temperature or process variations, etc.

In general, conventional closed loop ALC systems are implemented using power detectors to sample a portion of the transmitter output power level and convert the sampled power to a DC voltage that provides an indication of the output power level. By way of example, some conventional power detector circuit designs are implemented using a detector capacitor to capacitively couple a portion of transmission power from a transmission line to the input of a power detector circuit that includes a diode (e.g., PIN diode) to rectify the coupled power and an RC filter to filter the rectified signal and output a constant voltage signal proportional to the transmitter output power level. The output of the power detector circuit can processed using various techniques known in the art for closed loop control of transmission output power.

FIG. 1 is a generic schematic illustration of a conventional power detection method using a detector capacitor to capacitively couple a portion of transmission power from a transmission line to the input of a power detector circuit. FIG. 1 illustrates a portion of a transmission path for transmitting high-frequency power from a power source (e.g., power amplifier) to a load (e.g., antenna). The transmission path comprises a power detector (10) comprising a detector capacitor (12) which is interposed at a point along the transmission path between transmission lines (11A) and (11B). The transmission lines (11A, 11B) are depicted in their equivalent circuit model of a lossless transmission line having distributed capacitance Co and inductance Lo per unit length.

In conventional designs, the detector capacitor (12) can be used with a resistor to tap the voltage waveform of the signal at some point along the transmit path. For high frequency applications (microwave, millimeter wave) where the transmission lines 11A and 11B are on-chip microstrip lines or other printed transmission lines, the use of the detector capacitor (12) for capacitively coupling power to the detector circuit is problematic.

For instance, the size of the detector capacitor that is needed to provide a required coupling capacitance for a given application can pose practical limits on integration density for integrated millimeter wave systems. Moreover, assuming the transmission lines are designed for a given characteristic impedance $Z_O$ (e.g., 50 Ohms), the introduction of the detector capacitor (12) in the transmit path between the transmission lines (11A, 11B) produces an impedance discontinuity (impedance mismatch between the coupling capacitance of detector capacitor (12) and the characteristic impedance of the transmission lines) that can result in high insertion loss, decreased coupling efficiency, and lead to errors in power detection measurements.

To compensate for such impedance mismatches, a matching network may be used to match the impedance of the power detector (10) to the characteristic impedance $Z_O$ of the transmission lines (11A, 11B). For microwave and millimeter wave applications, however, the impedance matching networks for power detector can be large in size (thus limiting integration density) and ineffective for efficient power detection under variable loads.

SUMMARY OF THE INVENTION

In general, exemplary embodiments of the invention include circuits and methods for providing high efficiency on-chip power detection for microwave and millimeter wave applications. In one exemplary embodiment of the invention, a power detection circuit includes a power detector integrally formed within a printed transmission line to capacitively couple a portion of signal power propagating on the printed transmission line and a power detector circuit that receives coupled power output from the power detector to detect a power level of the signal power. The power detector is incorporated into the printed transmission line with low loss and without producing unwanted impedance mismatches between the integrated power detector and the characteristic impedance of transmission line.

In one exemplary embodiment, the printed transmission line generally comprises a conductive signal line disposed over a ground shield. The power detector includes a capacitor plate disposed between a portion of the conductive signal line and an opened region of the ground shield in a power detector region of the transmission line. The capacitor plate is coupled to an input of the power detector circuit. The capacitor plate and conductive signal line form a parallel plate coupling capacitor to detect power on the signal line. The integrated power detector design with the detector capacitor formed over the opened ground shield pattern allows the coupling capacitance of the integrated power detector to be absorbed by the distributed capacitance of the transmission line and maintain continuity of the characteristic impedance of the transmission line in the power detector region of the transmission line.

These and other exemplary embodiments, features and advantages of the present invention will be described or become apparent from the following detailed description of exemplary embodiments, which is to be read in connection with the accompanying drawings.

DETAILED DESCRIPTION OF EXEMPLARY EMBODIMENTS

In general, exemplary embodiments of the invention as described herein include power detection circuits and methods that enable high-efficiency on-chip power detection solutions for microwave and millimeter applications. In one aspect of the invention, high-efficiency power detection is realized by integrating power detector capacitors within printed transmission lines (e.g., microstrip line) to capacitively couple a portion of the signal power to a power detection circuit, while maintaining impedance continuity of the transmission line. The power detector capacitor is integrated within a region of the transmission line such that the coupling capacitance is absorbed into the distributed capacitance of the transmission line with no impedance discontinuity.

Figure 1:
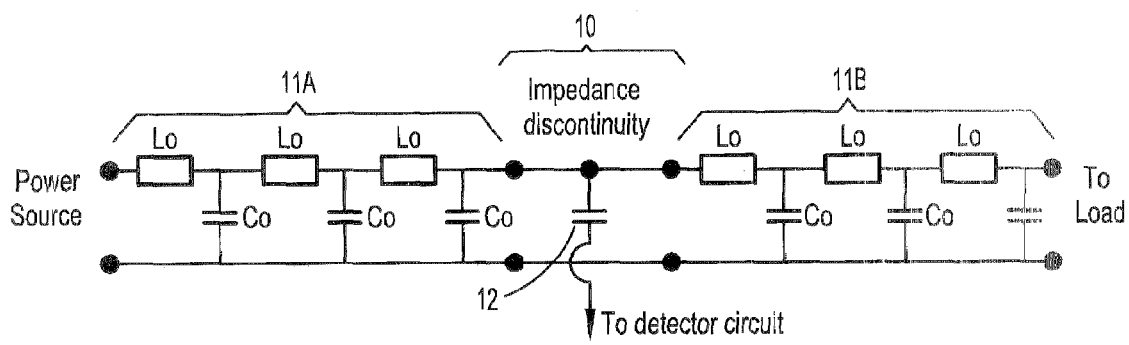
FIG. 1 is a schematic diagram that illustrates a conventional power detection method.
Figure 2:
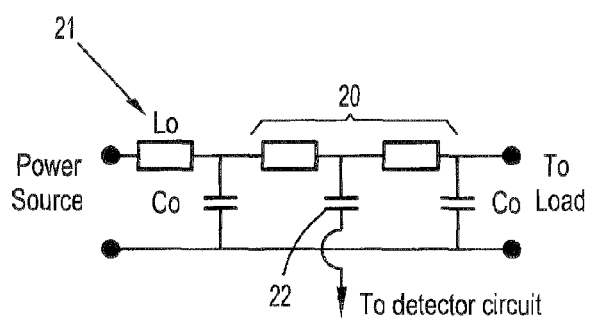
FIG. 2 is a high-level conceptual illustration of a method for integrating a detector coupling capacitor within an on-chip transmission line according to an exemplary embodiment of the invention.

FIG. 2 is a high-level conceptual illustration of a method for integrating a detector coupling capacitor within an on-chip transmission line according to an exemplary embodiment of the invention. FIG. 2 illustrates a transmission line (20) (depicted in the equivalent circuit model of a lossless transmission line), where a power detector region (20) of the transmission line (21) includes a detector coupling capacitor (22) integrated as part of the distributed capacitance of the transmission line (21) to couple a portion of the signal power to a power detector circuit. The integrated detector capacitor (22) is designed to provide a coupling capacitance that is suitable for high-efficiency, low-loss power coupling/detection, while providing a distributed capacitance to maintain the continuity of the characteristic impedance of the transmission line (21) in the power detector region (20) for efficient signal propagation.

In general, impedance continuity in the detector region (20) is achieved in consideration of transmission line electrical properties that the characteristic impedance $$\left( Z_O = \sqrt{\frac{L_O}{C_O}} \right)$$

of a transmission line is a function of the ratio between the inductance and capacitance per unit length (i.e., Lo/Co). In this regard, impedance continuity in the power detector region (20) is realized by designing the detector region (20) of the transmission line (21) such that the change in the distributed capacitance of the transmission is compensated by a change in distributed inductance, to maintain the ratio of Lo/Co constant for a given characteristic impedance. Exemplary frameworks for integrating power detector capacitors in printed transmission lines for power detection applications will be explained below with reference to FIGS. 4A, 4B and 5, for example.

It is to be appreciated that exemplary power detection circuit designs with transmission line-integrated coupling capacitors eliminates the need for various power detector components (lumped, distributed capacitors, inductors, etc.) for power coupling and impedance matching as in conventional power coupling/detection schemes. In this regard, exemplary power detection circuits and methods as described herein can be readily implemented for on-chip power detection applications at integration densities required for microwave and millimeter wave wireless communication applications. Moreover, exemplary embodiments of the invention provide high-efficiency, low-loss power detection solutions that can be readily implemented for various on-chip power detection, power measurement, and level control schemes for high-performance wireless applications.

Figure 3:
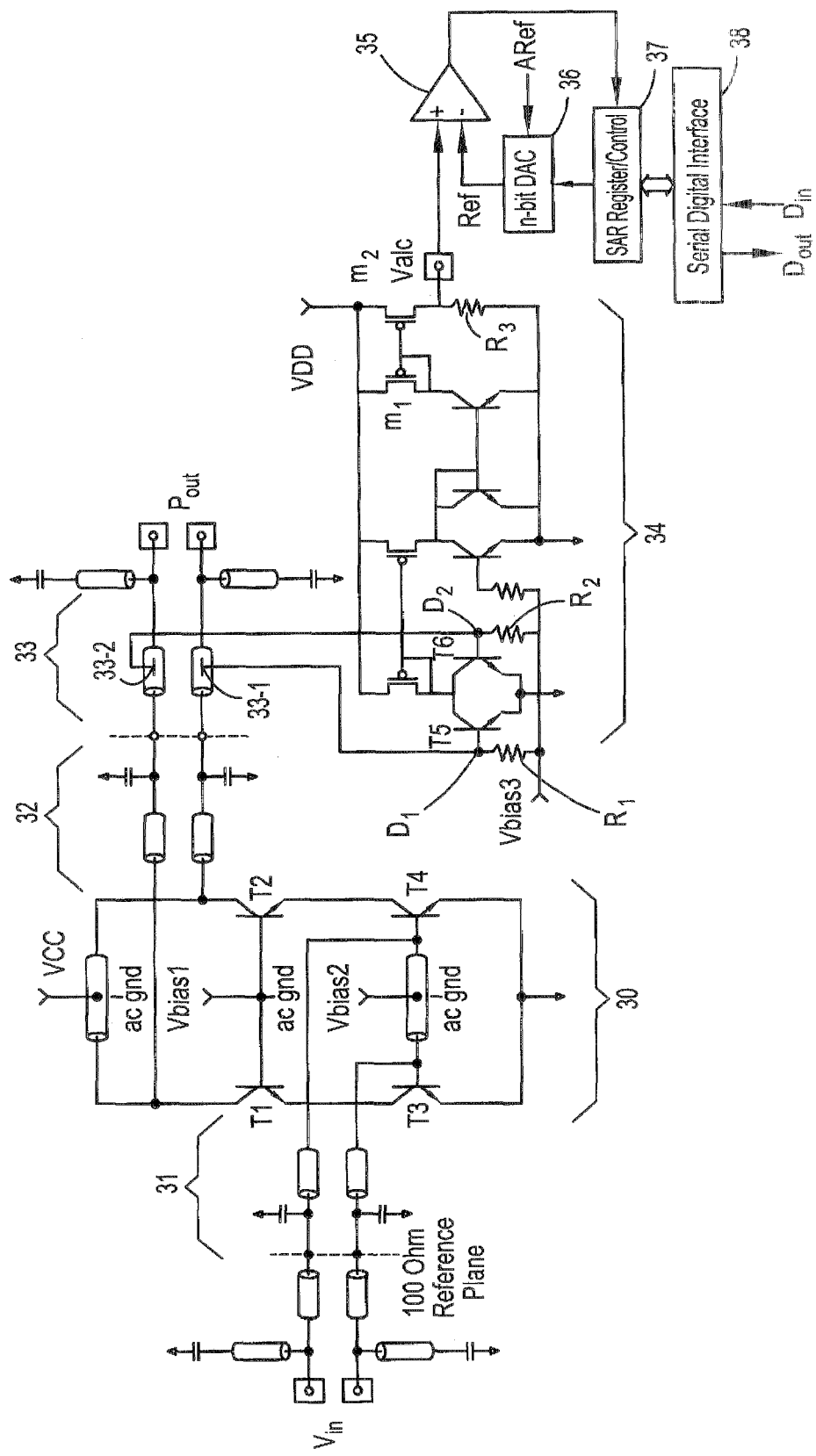
FIG. 3 schematically illustrates an integrated circuit for detecting power output from a power amplifier according to an exemplary embodiment of the invention.

By way of example, FIG. 3 schematically illustrates an integrated circuit for detecting power output from a power amplifier according to an exemplary embodiment of the invention. FIG. 3 illustrates a push-pull power amplifier (30) having a cascode differential amplifier framework. An input matching network (31) is connected to the differential inputs of the power amplifier (30) and an output matching network (32) is connected to the differential output nodes of the power amplifier (30). The cascode differential amplifier (30) includes a balanced cascode-stage comprising serially connected transistors T1 and T3, and transistors T2 and T4. The transistors T3 and T4 (common-emitter input stages) drive respective transistors T1 and T2 (common-base output stages).

A bias Voltage, Vbias2, is applied to the base terminals of transistors T3 and T4 and a constant DC voltage, Vbias1, is applied to the base terminals of transistors T1 and T2. These bias voltages are selected to prevent the base to collector voltage across each transistor T1~T4 from exceeding the breakdown voltage of the transistor in the cascode array and to divide the peak voltage applied between the collectors of T1 and T2 and emitters of respective transistors T3 and T4 to prevent breakdown.

The input terminals, Vin, are driven differentially with equal amplitude, opposite phase, high-frequency signals, which creates a virtual AC ground at the point where the VCC supply connection is made, and at the points where the bias voltage connections are made. The virtual AC grounds are points of low loss and low impedance. As such, the virtual AC ground at the voltage feed connection points eliminate the need for separate choke inductor and/or a large on-chip bypass capacitor at the voltage input connection.

Moreover, the output match circuit (32) is coupled to a different pair of output transmission lines (33) having a desired characteristic impedance $Z_O$ (e.g., 50 ohms) that lead to output pads (Pout) (e.g., chip I/O pads). An on-chip power detection circuit (34) is used to detect the output power of the amplifier (30) which is delivered to the output pads via the output transmission lines (33). The transmission lines (33) include integrated power detectors (33_1) and (33_2) having integrated detector capacitors that operate in conjunction with resistors R1 and R2, respectively, to capacitively couple output power on the output transmission lines (33) to respective input ports D1 and D2 of the power detector circuit (34).

In particular, the integrated power detectors (33_1) and (33_2) couple a portion of the signal voltage from the transmission lines (33) to the base terminals of an input pair of class-B biased CE transistors (T5, T6), which convert the signal voltage swing into a quiescent current level that is proportional to the output power propagating on the output transmission lines (33). Under large-signal conditions, the collector currents of T5 and T6 will be clipped (i.e., perform a two-way rectification of the input signals at input ports D1, D2). Consequently, the average (DC) collector currents increase above the quiescent levels. These DC collector currents are mirrored and multiplied (by transistor pair M1, M2) into an on-chip resistor R3, thereby outputting a constant voltage Valc proportional to the signal power on the transmission lines (33). The bias voltage Vbias3 is applied so that the output collector currents of T5 and 6 will remain linear with the signal at low power output levels.

The voltage output Valc can be used for various purposes such as dynamically controlling the output power of the amplifier (30) or obtaining power measurements to test chip operation, etc. By way of specific example, power amplifiers that operate at millimeter wave frequencies typically operate by biasing the amplifier transistors at current densities close to their peak fmax to provide high power gain at millimeter wave frequencies. Consequently, it is difficult to provide constant output power over temperature variations and to compensate for process variation that might exist in highly integrated radio circuits.

In the exemplary embodiment of FIG. 3, the output voltage Valc of the power detector circuit (34) can be digitized using an on-chip ADC (analog to digital converter) and then processed using digital processing techniques for automated power control, testing, etc. By way of example, in FIG. 3, an ADC converter is implemented using a comparator (35), n-bit DAC (digital to analog) converter (36), a successive approximation register/control (SAR) circuit (37) and serial digital interface (38). This circuit allows digitization of the power detector output voltage Valc using a software controlled successive approximation (37) to read out the delivered power level via the on-chip serial digital interface (38).

The comparator (35) has a non-inverting input connected to the output of the power detector (34) to receive the analog output voltage Valc, and an inverting input connected to the output of the programmable n-bit DAC (36) to receive a reference voltage Ref. The SAR (37) inputs an n-bit digital signal to the DAC (36) and the DAC (36) outputs a corresponding reference voltage, Ref, (derived based on an input analog voltage reference (ARef). If the output voltage Valc of the detector circuit (34) is larger than the output reference voltage Ref of the DAC (36), a logic "1" is the result of the comparison. On the other hand, if the output voltage Valc of the detector circuit (34) is less than the output reference voltage Ref of the DAC (36), a logic "0" is the result of the comparison. The result of the comparison is continually fed back into the successive approximation register (42), where a conversion process is performed to generate an n-bit digital signal indicative of the detector output voltage Valc. The serial digital interface (38) will serially output the digital Valc signal, where is can be digitally processed or otherwise used for testing or power control.

Figure 4B:
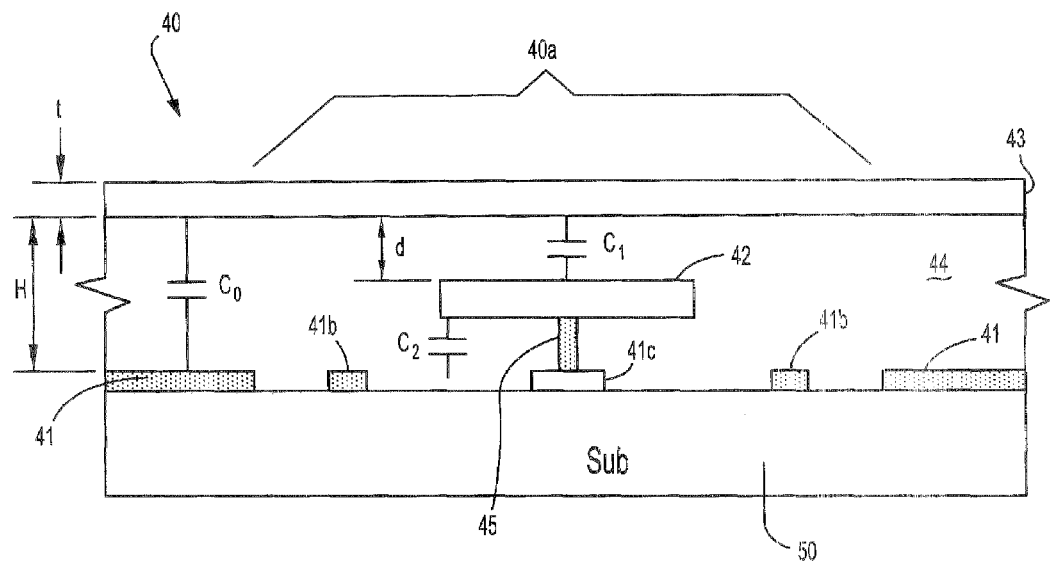
FIGS. 4A and 4B schematically illustrate a transmission line having an integrated power detector capacitor according to an exemplary embodiment of the invention.
Figure 4A:
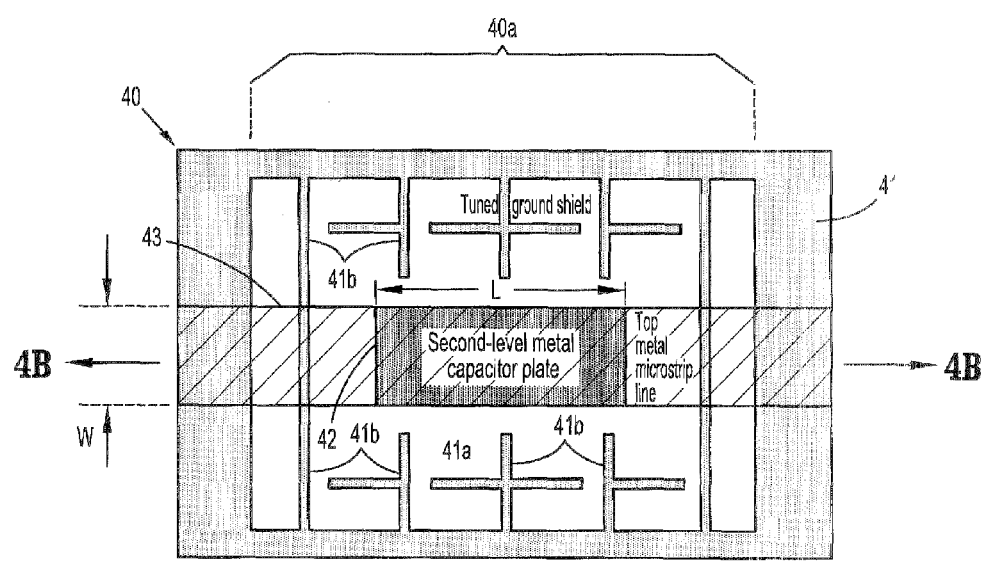

The digital signals for programming/controlling the ADC process can be input via the serial interface (38) from on-chip or external microprocessors or DSPs, or some other interface that drives the successive approximation ADC under software control. The various elements (35)-(38) can be implemented using known circuits and methods. Advantageously, this circuit simplifies testing of millimeter wave chips by providing a built-in self-test function that makes external probe contacts unnecessary. As such it greatly relaxes chip testing time and the cost of mmWave test equipment FIGS. 4A and 4B schematically illustrate a transmission line having an integrated power detector capacitor according to an exemplary embodiment of the invention. More specifically, FIG. 4A is schematic top plan view of a microstrip transmission line (40) having an integrated detector capacitor formed in a detector region (40a) of the microstrip transmission line (40) for capacitively coupling some signal power to an input port of a detector circuit. FIG. 4B is a schematic side-view of the microstrip line (40) in FIG. 4A along line 4B-4B. As depicted in FIGS. 4A and 4B, the microstrip line (40) comprises a first-level metal ground plane (41) (or ground shield) providing a wide reference ground plane for the microstrip transmission line (40), a second-level metal plate (42) providing a detector capacitor plate of length L and width W in the detector region (40a), and a third-level metal line comprising a conductive microstrip line (43) of width "W" and thickness "t". The microstrip line (43) and ground plane (41) are separated by dielectric material (44) of thickness "H".

Outside the detector region (40a), the microstrip line (40) has a standard framework, where the characteristic impedance $Z_O$ is determined as a function of the microstrip line width W and the effective dielectric constant and thickness t of the dielectric material (44), as is well-understood by those of ordinary skill in the art. Within the detector region (40a), the detector capacitor plate (42) (of area L×W) is aligned to, and disposed at a distance d from, a portion of the microstrip line (43). The detector capacitor plate (42) and microstrip line (43) effectively form a parallel plate detector capacitor with a capacitance C1, for capacitively coupling signal power from the microstrip line (43) to the detector capacitor plate (42). The detector capacitor plate (42) is connected to a contact pad (41c) by conductive plugs(s) (45), wherein the contact pad (41c) provides an output port of the power detector region (40a) which is electrically connected to an input port of an integrated detector circuit (not shown).

Moreover, the portion of the microstrip ground shield (41) in the detector region (40a) is patterned to form an opening (41a) that exposes portions of the substrate (50) surface below the ground shield metallization level, as well as a plurality of conductive strips (41b) that are disposed orthogonal or collinear to the direction of wave propagation in the longitudinal direction along the microstrip line (43). The contact pad (41c) is also formed by patterning the ground shield (41) metallization, but the contact pad (41c) is electrically isolated from the ground shield (41).

The patterned region of the ground shield (41) having opened region (41a) and conductive strips (41b) serves to compensate the increased distributed capacitance in the power detector region (40a) due to the detector coupling capacitor so as to maintain continuity of the characteristic impedance of the transmission line (40) in the detector region (40a). In particular, the opened region (41a) in the microstrip ground shield (41) causes an increase in the distributed inductance and a decrease in the distributed capacitance in the detector region, which would cause an impedance discontinuity for a standard microstrip line framework. However, the detector coupling capacitance C1 between the capacitor plate (42) and signal line (43) increase the capacitance in the power detection region (40a) that is higher than the capacitance per unit length (distributed capacitance Co) of the microstrip line (40) outside the power detector region (40a).

Accordingly, the detector capacitor plate (42) and patterned ground shield opening (41a) are designed so that the ratio of the capacitance and inductance per unit length in the detector region (40a) stays substantially constant for the designed $Z_O$ of the transmission line (40). In other words, the integrated power detector design with the detector capacitor formed over the opened ground shield pattern allows the coupling capacitance of the detector capacitor to be absorbed by the distributed capacitance of the transmission line (40) and maintain continuity of the characteristic impedance of the transmission line (40) in the power detector region (40a).

Essentially, the ground shield opening (41a) provides means for reducing the generation of image currents flowing in the microstrip ground shield (41) in the direction of wave propagation, thereby decreasing the coupling between the conductors (42) and (43) and the ground shield (41) in the detector region (40a) and effectively enhancing the capacitive coupling between the conductors (42) and (43).

Moreover, the opened region (41a) serves to minimize capacitive coupling C2 between the detector capacitor plate (42) and the ground shield (41), which advantageously serves to maintain impedance continuity under variable loads applied to the output port (41c) of the power detector region (40a). In particular, the detector coupling capacitance in the detector region (40a) is essentially formed by two series connected capacitors—a first capacitor with coupling capacitance C1 between the signal line (43) and the detector capacitor plate (42) and a second capacitor with coupling capacitance C2 between the detector capacitor plate (42) and the ground shield (41).

It is to be appreciated that this design ensures that any impedance discontinuity is minimal in two extreme cases: (i) the detector capacitor plate (42) is shorted to ground and (ii) the detector capacitor plate (42) is open (floating). This provides a flexible power detector design in the sense that suitable power detection performance can be realized for different detector circuit loads connected to the power detector port (41c) (e.g., changes in T5 and T6 in FIG. 2) or even completely different detector circuitry.

In other exemplary embodiment, the impedance of the transmission line (40) can be precisely matched while providing a known load through the detector circuit. For instance, assuming the transmission line (40) with an embedded power detector as shown in FIGS. 4A and 4B is implemented in the exemplary embodiment of FIG. 3, an additional buffer amplifier can be coupled between the rectifying transistors T5 and T6 to provide a fixed load impedance to the transmission line (40). In this manner, the input impedance of the buffer amplifier can be tuned to the $Z_O$ (e.g., 50 Ohms) which will be a known load at the output (41c) of the power detector capacitor. It should be appreciated that the use of an additional buffer amplifier would allow a reduction in the coupling capacitance of the detector capacitor and achieve better impedance continuity control.

Moreover, the pattern of conductive strips (41b) in the patterned region of the ground shield (41) region can be appropriately designed to provide effective EM shielding between the power detector region (40a) and the exposed portion of substrate (50) (e.g., silicon substrate). In particular, the power detector capacitor can be shielded from active circuitry which may be formed in the exposed portion of the substrate (50) below the detector region (40a), as well as reduce substrate induced losses by preventing EM energy in the power detector region (40a) from flowing into the substrate (50). Thus, effective EM shielding enables precise design of the detection capacitors while providing high efficiency. The EM shielding simplifies the design of the various capacitances including the capacitance C1 between the signal line (43) and detector capacitor plate (42), the capacitance C2 between the capacitor plate (42) and the ground shield (41) and the capacitance CO between the signal line (43) to the ground shield (41).

Figure 5:
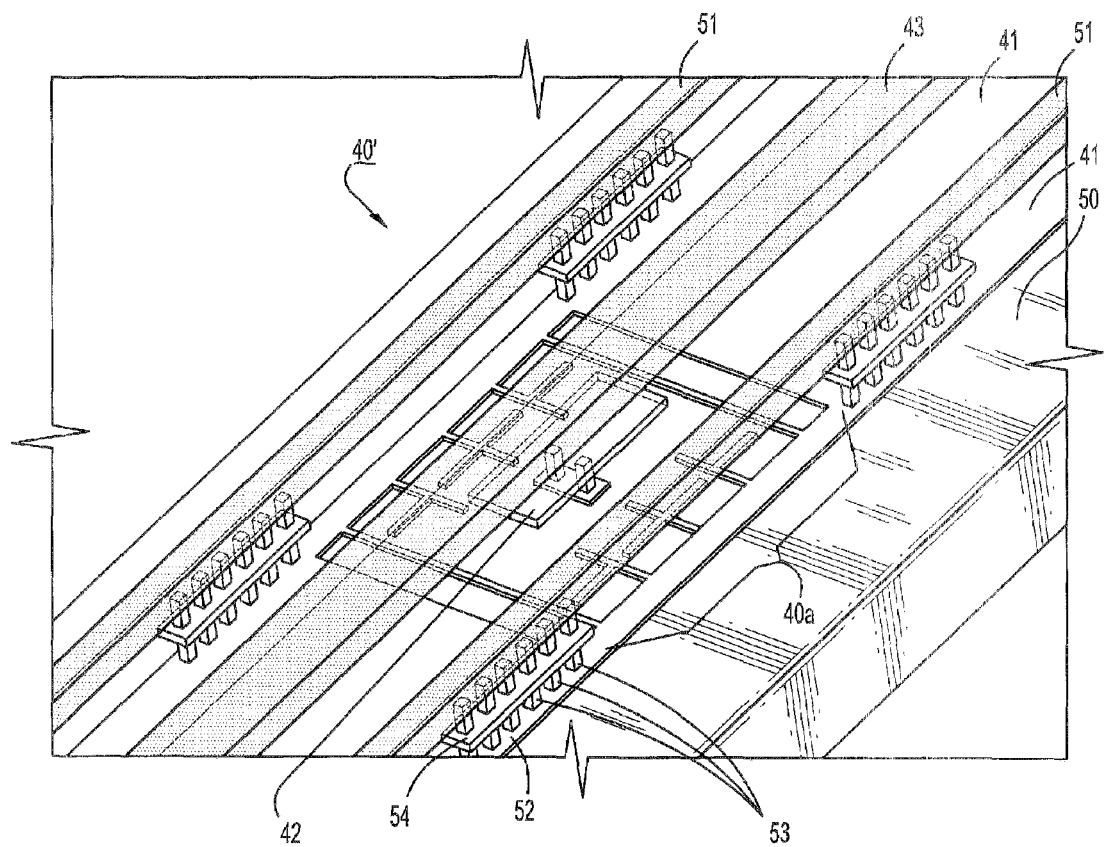
FIG. 5 schematically illustrates a transmission line having an integrated power detector capacitor according to another exemplary embodiment of the invention.

FIG. 5 is a schematic perspective view of a transmission line having an integrated power detector capacitor according to another exemplary embodiment of the invention. The exemplary design in FIG. 5 is similar to that discussed above with reference to FIGS. 4A and 4B, except that the exemplary framework in FIG. 5 includes additional top-side ground lines (51) formed on the third-level metal on either side of the microstrip line (43). In FIG. 5, the ground lines (51), signal line (43), and metal capacitor plate (42) are shown in phantom. The ground lines (51) serve to maintain the impedance continuity of the transmission line (40) along the detector region (40a). The top-side ground lines (51) are connected to the bottom-side microstrip ground shield (41) using connector structures (52) formed of multiple, inter-level conductive through via structures (53) and second metal level pads (54). The top side ground lines (51) provide well-defined current return paths that are collinear to wave propagation, as well as means for shielding/isolating the power detector region (40a) from the effects of other components/elements (e.g., vias, amplifiers, wiring, grounds, etc.) surrounding or in proximity thereto.

It is to be appreciated that various semiconductor fabrication methods may be used for constructing the exemplary transmission line structures with integrated power detectors as depicted in FIGS. 4A, 4B and 5. For high-frequency applications, the exemplary designs can be fabricated based on compound semiconductor technologies such as GaAs (gallium-arsenide) or SiGe (silicon germanium), or other technologies that are suitable for highly integrated circuits operating in millimeter-wave frequency ranges.

Although illustrative embodiments have been described herein with reference to the accompanying drawings, it is to be understood that the present invention is not limited to those precise embodiments, and that various other changes and modifications may be affected therein by one skilled in the art without departing from the scope or spirit of the invention. All such changes and modifications are intended to be included within the scope of the invention as defined by the appended claims.

We claim:
1. A power detection circuit, comprising:
a power detector integrally formed within a printed transmission line to capacitively couple a portion of signal power propagating on the printed transmission line; and
a power detector circuit that receives coupled power output from the power detector to detect a power level of the signal power,
wherein the printed transmission line comprises a conductive signal line disposed over a ground shield, and wherein the power detector comprises a capacitor plate disposed between a portion of the signal line and an opened region of the ground shield, wherein the capacitor plate is coupled to an input of the power detector circuit.

2. The power detection circuit of claim 1, wherein the power detector comprises an integrated detector capacitor having a coupling capacitance that is absorbed into a distributed capacitance of the transmission line to maintain continuity of a characteristic impedance of the transmission line.

3. The power detection circuit of claim 1, wherein the opened region of the ground shield is patterned to provide electromagnetic shielding between the power detector and a substrate on which the printed transmission line is formed.

4. The power detection circuit of claim 1, wherein the printed transmission line is a microstrip line.

5. The power detection circuit of claim 1, further comprising conductive ground lines disposed on opposite sides of the signal line in a power detector region of the transmission line, and interconnect structures for coupling the conductive ground lines to the ground shield of the transmission line around the power detection region.

6. The power detection circuit of claim 1, wherein the printed transmission line is an output transmission line coupled to an output pad of an integrated circuit chip, wherein the power detection circuit detects a level of output power delivered to the output pad.

7. The power detection circuit of claim 6, wherein the power detection circuit further comprises:
    an analog to digital converter (ADC) circuit to convert an output voltage of the power detector circuit to a digital signal; and
    a serial digital interface to programmatically control the ADC circuit and output the digital signal.

8. The power detection circuit of claim 7, wherein the ADC circuit comprises a comparator and a digital to analog converter (DAC).

9. A wireless communications system, comprising:
    a semiconductor integrated circuit chip comprising an integrated circuit, wherein the integrated circuit comprises:
    a printed transmission line for coupling a transmission signal to an output pad of the chip; and
    a power detection circuit for detecting a power level of the transmission signal, wherein the power detection circuit comprises:
    a power detector integrally formed within a printed transmission line to capacitively couple a portion of transmission power propagating on the printed transmission line and;
    a power detector circuit that receives coupled transmission power output from the power detector to detect a power level of the transmission signal,
    wherein the printed transmission line comprises a conductive signal line disposed over a ground shield, and wherein the power detector comprises a capacitor plate disposed between a portion of the signal line and an opened region of the ground shield, wherein the capacitor plate is coupled to an input of the power detector circuit.

10. The device of claim 9, wherein the power detector comprises an integrated detector capacitor having a coupling capacitance that is absorbed into a distributed capacitance of the transmission line to maintain continuity of a characteristic impedance of the transmission line.

11. The device of claim 9, wherein the opened region of the ground shield is patterned to provide electromagnetic shielding between the power detector and a substrate on which the printed transmission line is formed.

12. The device of claim 9, wherein the printed transmission line is a microstrip line.

13. The device of claim 9, further comprising conductive ground lines disposed on opposite sides of the signal line in a power detector region of the transmission line, and interconnect structures for coupling the conductive ground lines to the ground shield of the transmission line around the power detection region.

14. The device of claim 9, wherein the integrated circuit comprises an integrated transmitter circuit.

15. The device of claim 9, wherein the integrated circuit comprises a power amplifier, wherein the power detection circuit provides on-chip detection of power output from the power amplifier.

16. The device of claim 9, wherein the integrated circuit further comprises an analog to digital converter (ADC) circuit to convert an output voltage of the power detector circuit to a digital signal; and
    a serial digital interface to programmatically control the ADC circuit and output the digital signal.

17. The device of claim 16, wherein the ADC circuit comprises a comparator and a digital to analog converter (DAC).

18. A method for detecting power in a printed transmission line, comprising:
    forming a printed transmission line on a substrate, wherein the printed transmission line comprises a signal line and ground shield structured to provide a characteristic impedance; and
    integrally forming a power detector in a region of the printed transmission line for detecting signal power transmitted in the printed transmission line,
    wherein integrally forming the power detector comprises:
    forming a capacitor plate between the signal line and the ground shield; and
    forming an opening in a region of the ground shield below the capacitor plate;
    wherein the capacitor plate and ground shield opening are formed to provide a coupling capacitance for detecting power on the signal line such that the coupling capacitance is absorbed by the distributed capacitance of the transmission line to maintain continuity of the characteristic impedance in the power detector region of the transmission line.

* * * * *